(12) United States Patent
Takahashi

(10) Patent No.: US 8,093,073 B2
(45) Date of Patent: *Jan. 10, 2012

(54) MANUFACTURING METHOD OF A TRAY, A SOCKET FOR INSPECTION, AND A SEMICONDUCTOR DEVICE

(75) Inventor: Noriyuki Takahashi, Nanae (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/021,365

(22) Filed: Feb. 4, 2011

(65) Prior Publication Data

US 2011/0129325 A1 Jun. 2, 2011

(30) Foreign Application Priority Data

Mar. 12, 2004 (JP) ................................. 2004-070476

(51) Int. Cl.
H01L 21/66 (2006.01)

(52) U.S. Cl. ........... 438/14; 438/464; 438/465; 324/758

(58) Field of Classification Search .................... 438/14, 438/17, 113, 114, 459–465; 324/758
See application file for complete search history.

(56) References Cited

U.S. PATENT DOCUMENTS

| | | | |
|---|---|---|---|
| 6,002,266 A | 12/1999 | Briggs et al. | |
| 6,064,217 A | 5/2000 | Smith | |
| 6,472,892 B2 | 10/2002 | Pochmuller | |
| 7,093,358 B2 | 8/2006 | Akram et al. | |
| 7,101,735 B2 | 9/2006 | Noma et al. | |
| 7,374,970 B2 * | 5/2008 | Takahashi | ...................... 438/113 |
| 7,915,057 B2 * | 3/2011 | Takahashi | ........................ 438/14 |
| 2001/0032800 A1 | 10/2001 | Numazaki et al. | |

FOREIGN PATENT DOCUMENTS

| | | |
|---|---|---|
| JP | 06-013454 | 1/1994 |
| JP | 10-230991 | 9/1998 |
| JP | 10-329886 | 12/1998 |
| JP | 11-011572 | 1/1999 |
| JP | 2002-2871 | 1/2002 |
| JP | 2002-166994 | 6/2002 |
| JP | 2004-182297 | 7/2004 |
| JP | 2005-057021 | 3/2005 |

OTHER PUBLICATIONS

Japanese Official Action dated Nov. 24, 2009, for Application No. 2004-070476.

* cited by examiner

*Primary Examiner* — Kevin M Picardat
(74) *Attorney, Agent, or Firm* — Antonelli, Terry, Stout & Kraus, LLP.

(57) ABSTRACT

The yield of semiconductor devices is to be enhanced. A tray is provided with a plurality of pockets each capable of accommodating a wafer level CSP, and each of the pockets is provided with a base for supporting a plurality of bumps of the wafer level CSP and side walls formed around the base. In the step-to-step carriage in the post-production process of the manufacture of wafer level CSPs and on like occasions, the base supports not the organic film but the plurality of solder bumps. For this reason, it is made possible to prevent the organic film from being flawed or coming off and adhering to the product as foreign matter, and as a result the quality and yield of the wafer level CSPs (semiconductor devices) can be improved.

10 Claims, 12 Drawing Sheets

US 8,093,073 B2

MANUFACTURING METHOD OF A TRAY, A SOCKET FOR INSPECTION, AND A SEMICONDUCTOR DEVICE

CROSS-REFERENCE TO RELATED APPLICATION

The present application claims priority from Japanese patent application No. 2004-070476 filed on Mar. 12, 2004, the content of which is hereby incorporated by reference into this application. This application is a Divisional application of application Ser. No. 12/117,341, filed May 8, 2008, which is a Divisional application of application Ser. No. 11/058,237, filed Feb. 16, 2005, the contents of which are incorporated herein by reference in their entirety.

BACKGROUND OF THE INVENTION

The present invention relates to a tray, and a socket for inspection and a method of manufacturing semiconductor devices, and more particularly to a technique that can be effectively applied to the prevention of adherence of foreign matter.

A conventional tray for accommodating a semiconductor integrated circuit device has, in an accommodating portion disposed on the front surface of the tray, a structure in which a BGA (ball grid array type semiconductor integrated circuit device) supporting part and a BGA fixing portion are snapped onto or engaged with each other. The BGA supporting part consists of a structural portion comprising a surface supporting the BGA and walls regulating the movement of the BGA in the horizontal direction. The BGA fixing portion, disposed on the rear surface of the tray, consists of a structural portion comprising a surface supporting the BGA and walls regulating the movement of the BGA in the horizontal direction when the tray is turned over (see Patent Reference 1 for instance).

Patent Reference 1: Japanese Unexamined Patent Publication No. Hei 11(1999)-11572 (FIG. 9)

SUMMARY OF THE INVENTION

Among small semiconductor devices including CSPs (chip scale packages), CSP type semiconductor device that can be assembled by a manufacturing technique integrating a wafer process (front-end process) and a packaging process (post-production process) (such semiconductor devices are referred to as wafer level CSPs or wafer process packages) have been developed.

In the manufacture of wafer level CSPs, fragmentation into individual pieces from a wafer state is carried out by dicing in its post-production process, the pieces are once packed into a dedicated jig, later taken out of the dedicated jig to be accommodated into a tray and carried from one step of the process to the next in the state of being accommodated in this tray. At each step of inspection, each piece is taken out of the tray, and fitted into a socket for inspection to undergo inspection.

Incidentally in a wafer level CSP, there is stacked over the wiring layer formed over the main surface of the semiconductor chip an organic film to protect the layer, and the tray and the socket for inspection are so shaped as to support the organic film of the wafer level CSP.

Therefore, by supporting the organic film, the organic film may suffer flaws or peeled off. Since the organic film is thin, peeling of the organic film would expose wiring, resulting in a problem of inviting trouble in electrical performance, such as short-circuiting of the wiring.

Furthermore, the trouble in electrical performance and a deterioration in the quality of appearance would give rise to a further problem of a drop in yield.

Furthermore, in the tray described in the above-cited Patent Reference 1 (Japanese Unexamined Patent Publication No. Hei 11(1999)-11572), as it supports the organic film on the surface of the wafer level CSP in accommodating the wafer level CSP into its BGA supporting part (which may also be referred to as pocket), a flaw may occur or foreign matter may be generated on the organic film or the organic film may be peeled off to expose the wiring underneath, resulting in a problem of inviting troubles in electrical performance, such as short-circuiting of the wiring.

Furthermore, holes penetrating to the rear side are formed extensively in the BGA supporting part, which constitutes a pocket, not only making it impossible to turn over the wafer level CSP to support ball electrodes, which are its external terminals, but also giving rise to a fear that, when a plurality of trays are stacked, foreign matter generated from the organic film or the like may drop on a wafer level CSP on the tray of a lower level and adhere to the wafer level CSP.

An object of the present invention is to provide a tray, a socket for inspection, and a method of manufacturing semiconductor devices, all capable of facilitating enhancement of the product yield.

Another object of the invention is to provide a tray, a socket for inspection, and a method of manufacturing semiconductor devices, all capable of facilitating improvement of the product quality.

Still another object of the invention is to provide a tray, a socket for inspection, and a method of manufacturing semiconductor devices, all capable of contributing to cost reduction.

The above-described and other objects and novel features of the invention will become more apparent from the following description in this specification when taken in conjunction with accompanying drawings.

A summary of advantages achieved by some of the most typical aspects of the invention disclosed in the present application will be briefly described below.

A tray according to the invention is capable of accommodating semiconductor devices each having a main surface and a rear surface opposite to the main surface; a wiring layer formed over the main surface; a semiconductor chip having an organic film covering the wiring layer and containing opening portions in which the wiring layer is partly exposed; a plurality of ball electrodes electrically connected to the wiring layer, wherein a plurality of accommodating portions each capable of accommodating the semiconductor device are provided; and wherein each of the accommodating portions has a base to support the plurality of ball electrodes of the semiconductor device, and side walls formed around the base.

According to the invention, a socket for inspection to which a semiconductor device comprising a semiconductor chip having on its main surface an organic film covering a wiring layer and a plurality of ball electrodes, which are external terminals, is to be fitted and which permits electrical inspection of the semiconductor device, further has insulative sheet members having opening portions permitting the arrangement of the ball electrodes of the semiconductor device and supporting the organic film of the semiconductor device; a plurality of terminal portions arranged in the opening portions in the sheet members respectively matching the plurality of ball electrodes of the semiconductor device and capable of coming into contact with the ball electrodes; and a conductor portion being in tight contact with the sheet members and provided with wiring for connection to the terminal portions, wherein a plurality of the terminal portions are arranged in one of the opening portions in the sheet members.

A method of manufacturing semiconductor devices according to the invention comprises a step of preparing a semiconductor wafer provided with a plurality of semiconductor device forming areas having an organic film covering a wiring layer formed over each main surface and a plurality of ball electrodes, which are external terminals, respectively arranged in a plurality of opening portions in the organic film; a step of forming a plurality of semiconductor devices by dividing the semiconductor wafer by dicing according to the semiconductor device formation areas; and a step of inspecting, after the step of forming semiconductor devices, the plurality of ball electrodes of the semiconductor devices in a state of being supported.

Another method of manufacturing semiconductor devices according to the invention comprises a step of preparing a semiconductor wafer provided with a plurality of semiconductor device forming areas having an organic film covering a wiring layer formed over each main surface and a plurality of ball electrodes, which are external terminals, respectively arranged in a plurality of opening portions in the organic film; a step of forming a plurality of semiconductor devices by dividing the semiconductor wafer by dicing according to the semiconductor device formation areas; and a step of carrying, after the step of forming the semiconductor devices, the semiconductor devices in a state of the plurality of ball electrodes of the semiconductor devices being supported and subjecting the semiconductor devices to a burn-in test.

Advantages achieved by some of the most typical aspects of the invention disclosed in the present application will be briefly described below.

In the tray capable of accommodating a semiconductor device provided with a semiconductor chip having an organic film covering a wiring layer formed over each main surface and a plurality of ball electrodes, each of a plurality of accommodating portions for accommodating the semiconductor devices has a base for supporting a plurality of ball electrodes to enable, when semiconductor devices are accommodated in the accommodating portions of the tray in the step-to-step carriage in the post-production process of semiconductor device manufacturing or on like occasions, the base to support not the organic film but the plurality of ball electrodes. For this reason, it is made possible to prevent the organic film from being flawed or coming off and adhering to the product as foreign matter, and as a result the quality and yield of the semiconductor devices can be improved.

DESCRIPTION OF THE PREFERRED EMBODIMENT OF THE INVENTION

In the following description of the preferred embodiment of the invention, description of the same or similar parts will not be repeated in principle unless repetition is necessary.

In the following description of the embodiment, though any single embodiment may be referred to as a plurality of sections or embodiments into which it is divided where the convenience of description requires such division, the divided sections or embodiments are not unrelated to one another unless expressly stated otherwise, but each is a modification, details or supplementary explanation of any part or the whole of others.

In the following description of the embodiment, where the number (value, quantity, range or the like) of any element is referred to, its number or the like is not confined to that stated number or the like but any other number greater or smaller than that stated one may be acceptable unless confinement is expressly stated or evident from the underlying principle.

A preferred embodiment of the present invention will be described in detail below with reference to drawings. In all the drawings illustrating the embodiment, members having the same function will be denoted by respectively the same reference signs, and their description will not be repeated.

Figure 1:
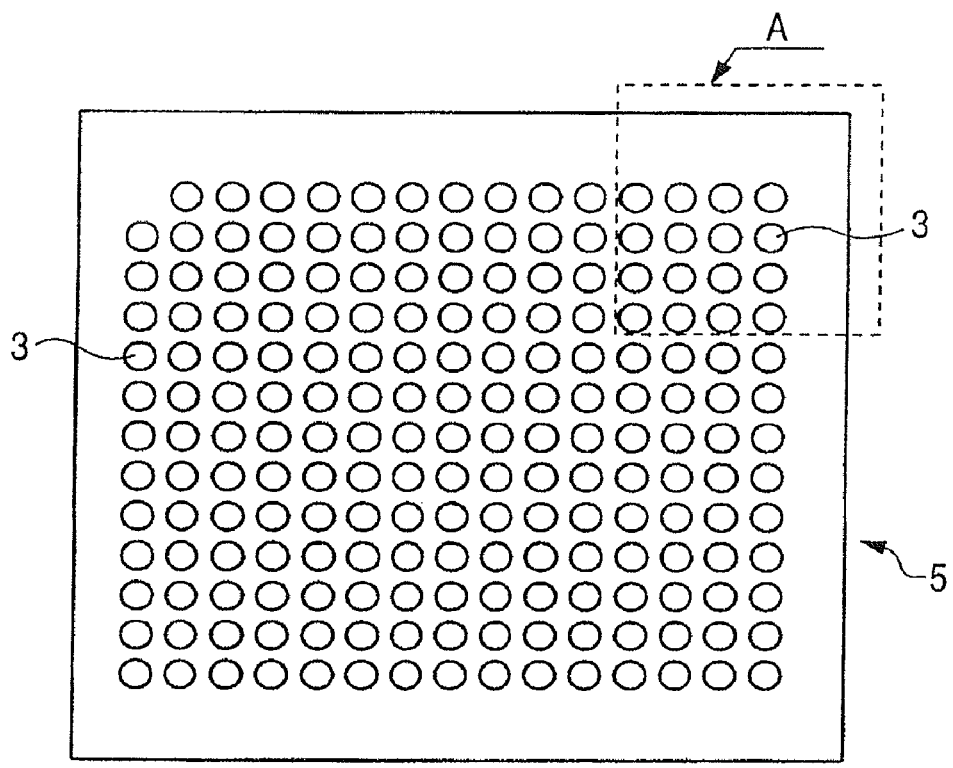
FIG. 1 shows a plan of one example of structure of semiconductor device manufactured by the semiconductor device manufacturing method in a mode of carrying out the present invention.
Figure 2:
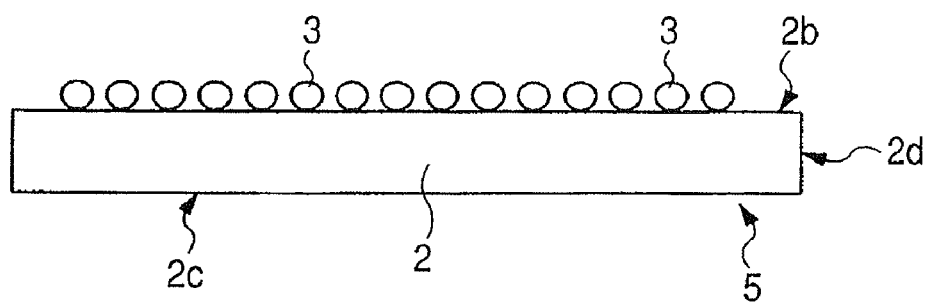
FIG. 2 is a profile of the structure of the semiconductor device shown in FIG. 1.
Figure 3:
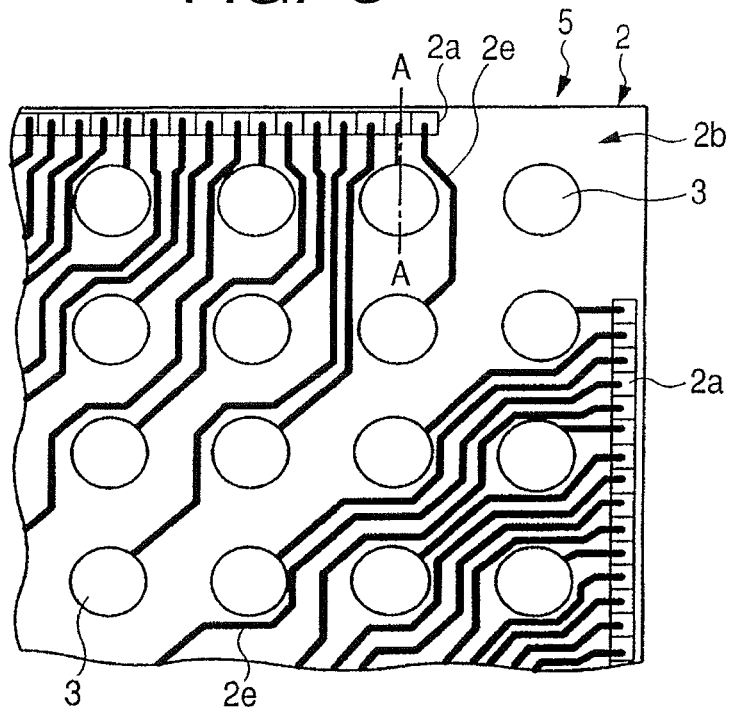
FIG. 3 shows an enlarged partial plan of part A in FIG. 1.
Figure 4:
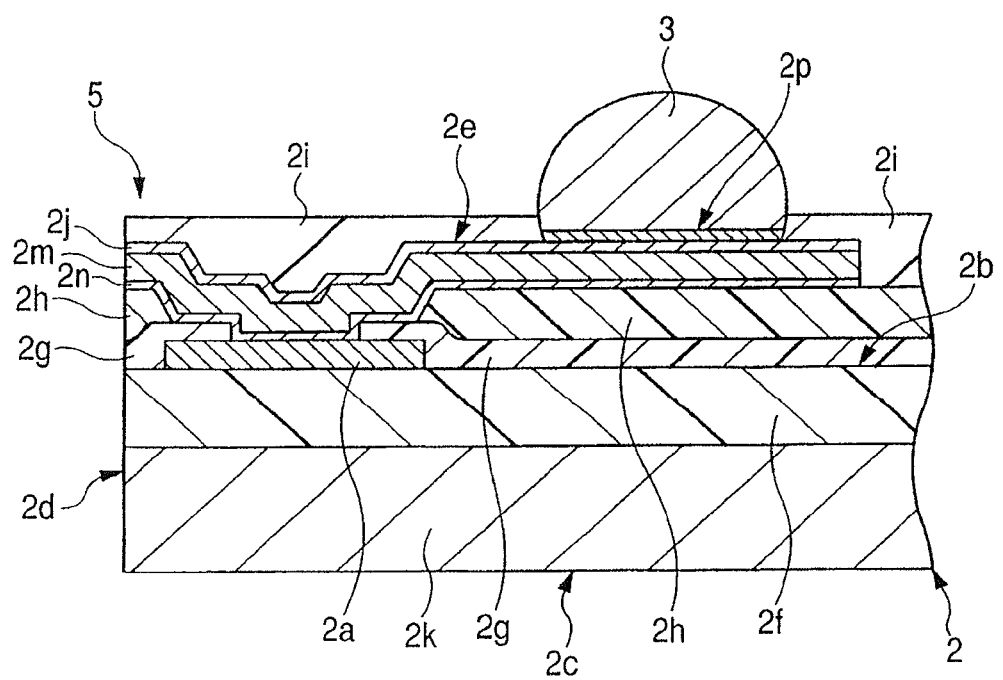
FIG. 4 is a partial section showing the structure cut along line A-A in FIG. 3.
Figure 5:
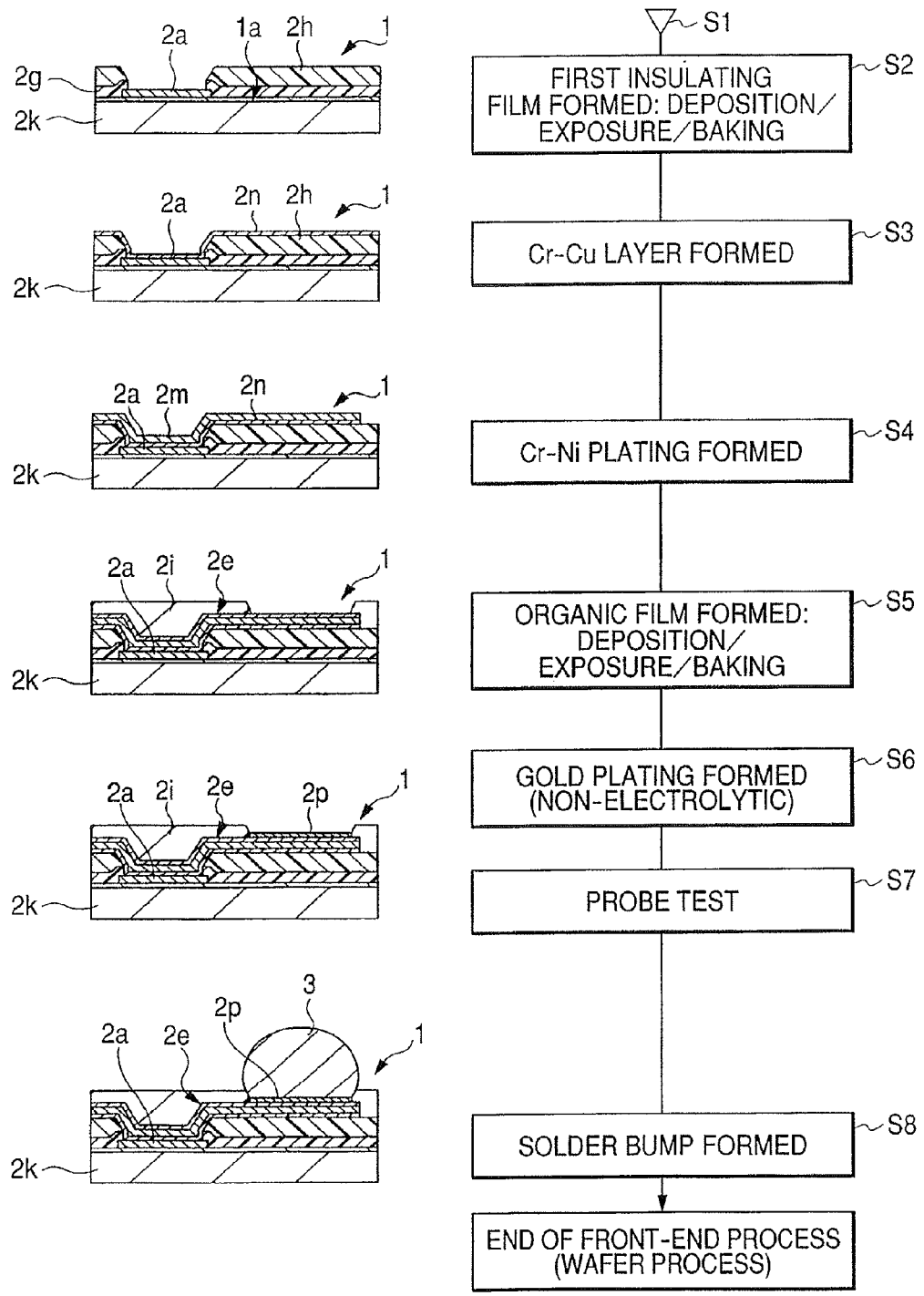
FIG. 5 comprises a process flow chart and a section showing one example of procedure of the front-end process (wafer process) in the assembling of the semiconductor device shown in FIG. 1.
Figure 6:
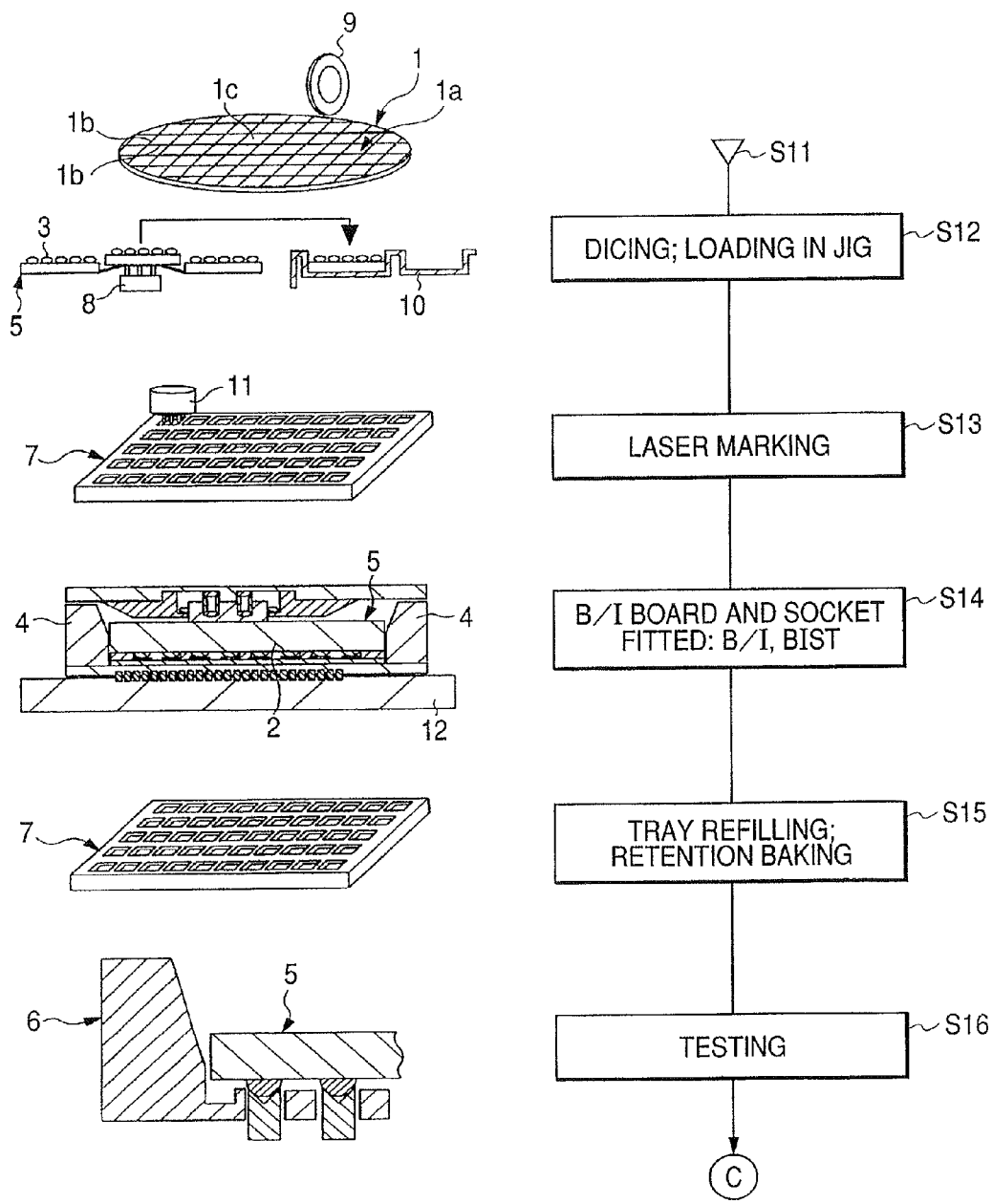
FIG. 6 comprises a process flow chart, a perspective view and a section showing part of one example of procedure of the post-production process in the assembling of the semiconductor device shown in FIG. 1.
Figure 7:
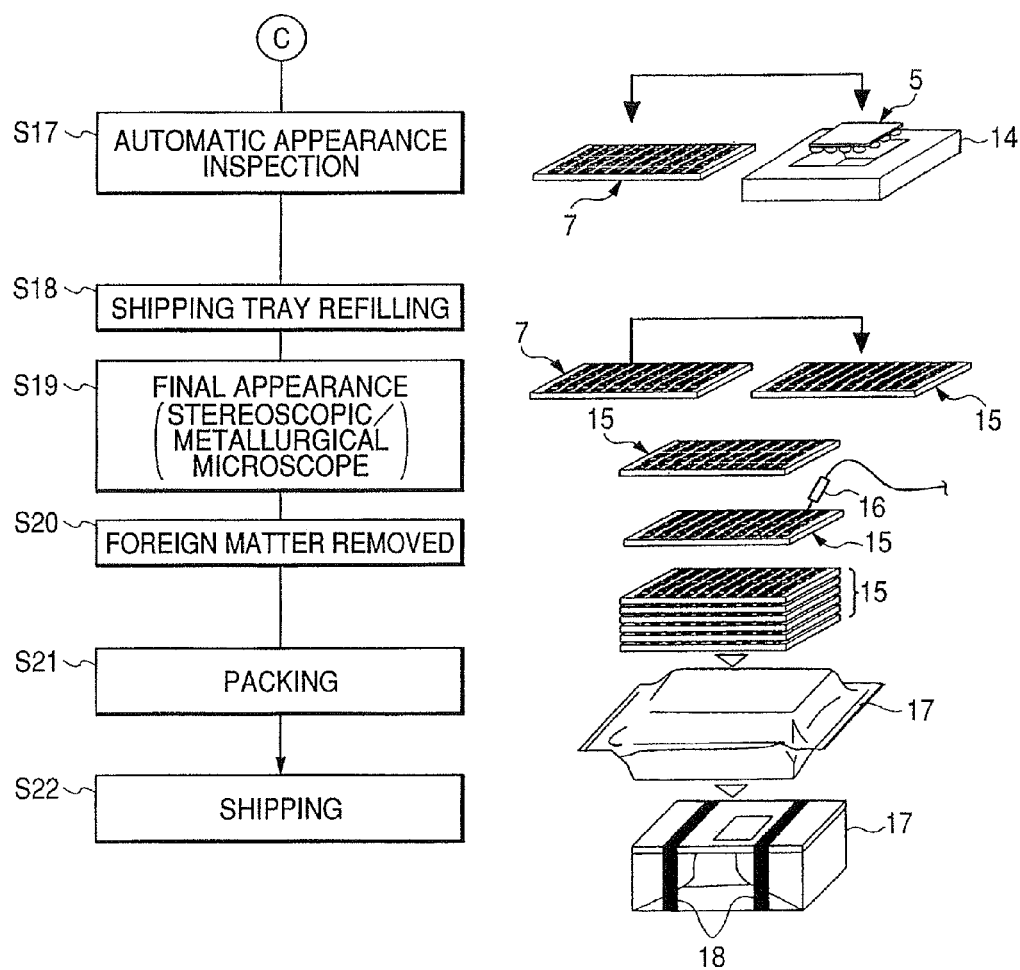
FIG. 7 comprises a process flow chart and a perspective view showing part of one example of procedure of the post-production process in the assembling of the semiconductor device shown in FIG. 1.
Figure 8:
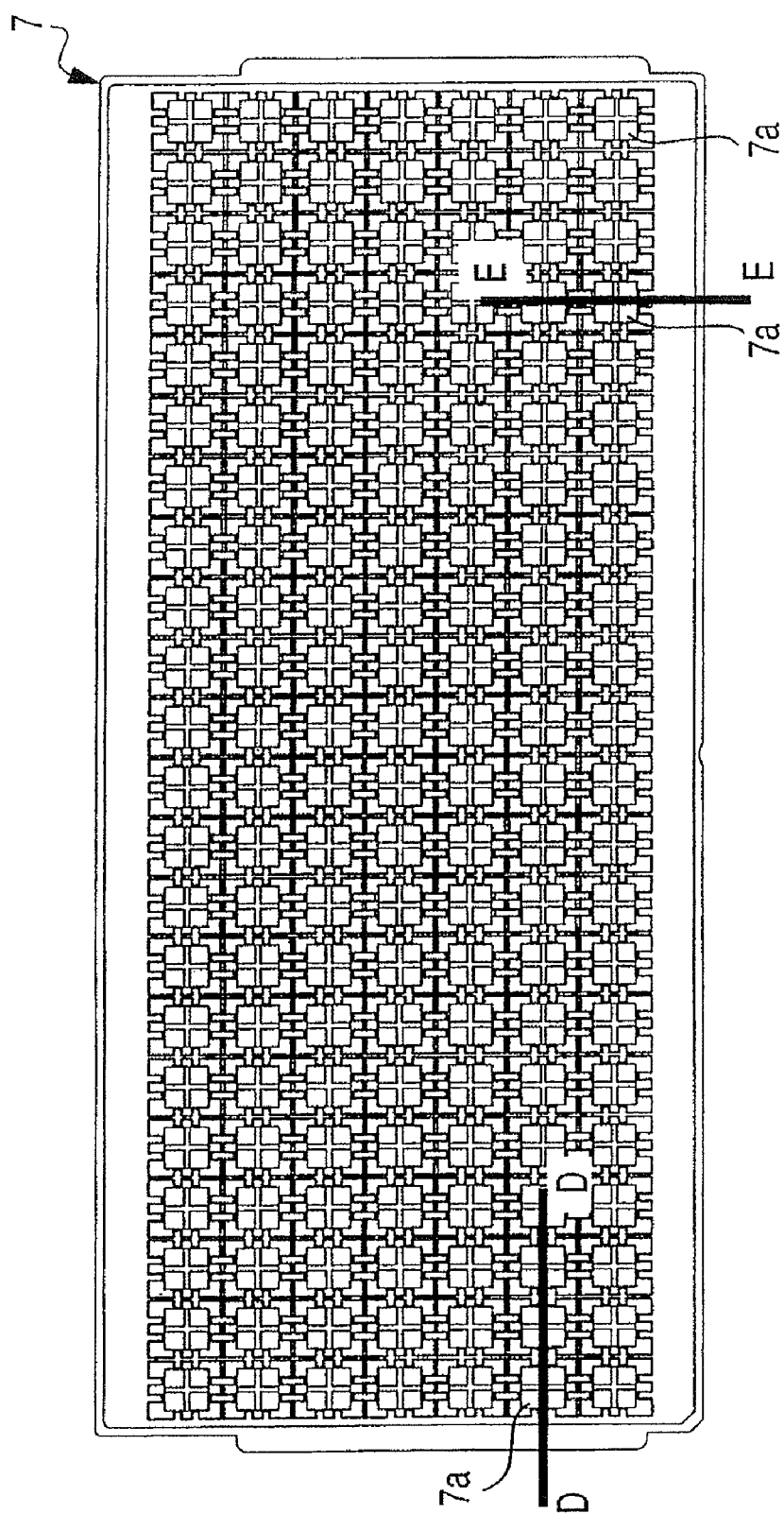
FIG. 8 is a plan showing one example of structure of a tray in a mode of carrying out the invention.
Figure 9:
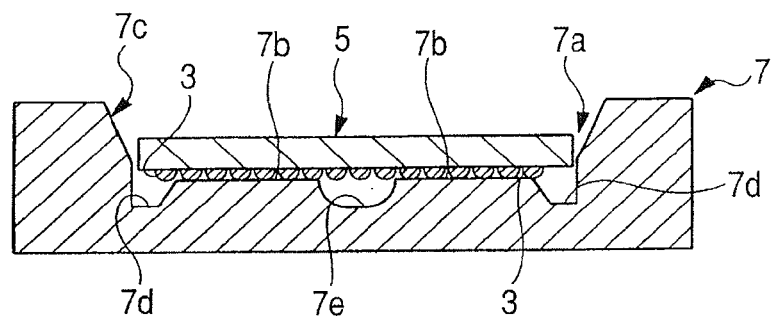
FIG. 9 is a section showing one example of structure of the accommodating portion the tray shown in FIG. 8.
Figure 10:
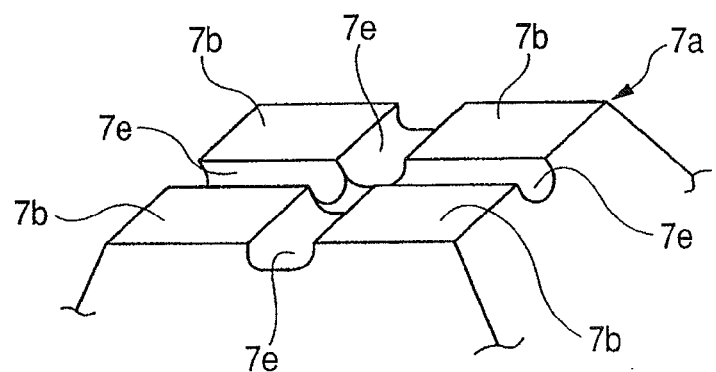
FIG. 10 is a partial perspective view one example of structure of the base in the accommodating portion of the tray shown in FIG. 9.
Figure 11:
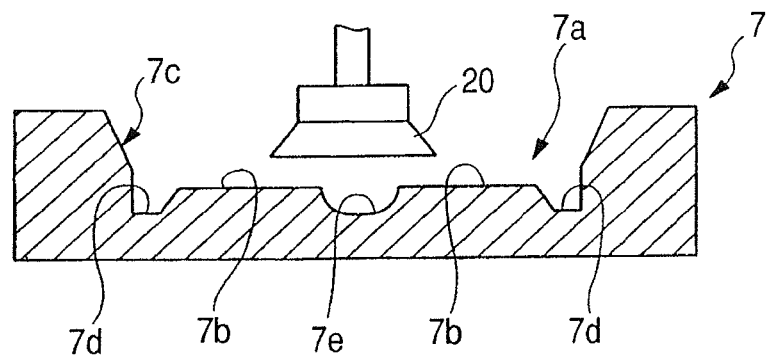
FIG. 11 is a section showing one example of method of accommodating a semiconductor device in the tray shown in FIG. 9.
Figure 12:
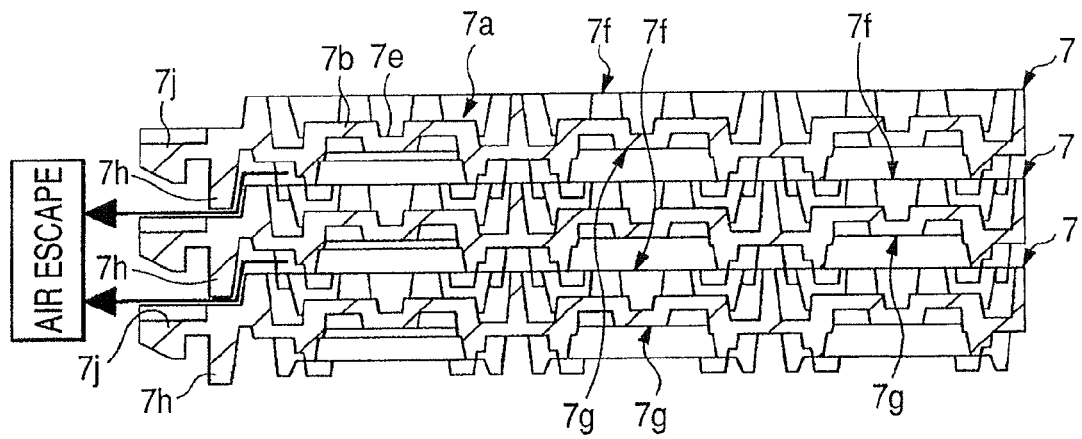
FIG. 12 is a partial section showing one example of structure of the tray-stacked state cut along line D-D shown in FIG. 8.
Figure 13:
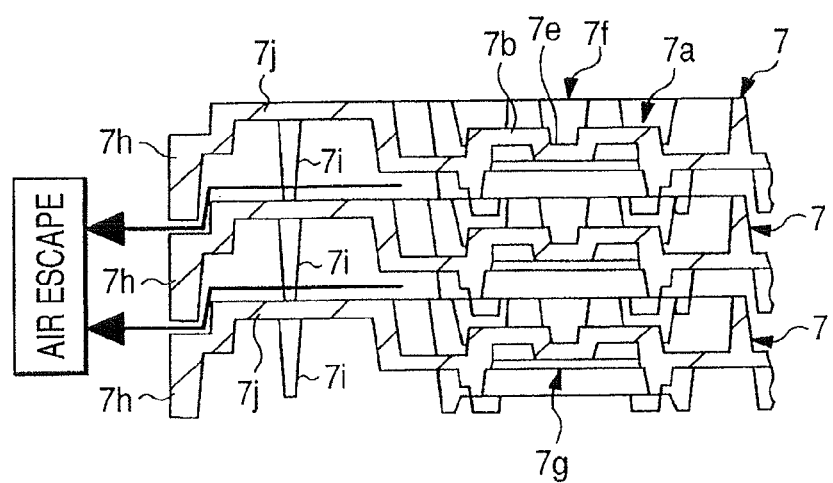
FIG. 13 is a partial section showing one example of structure of the tray-stacked state cut along line E-E shown in FIG. 8.
Figure 14:
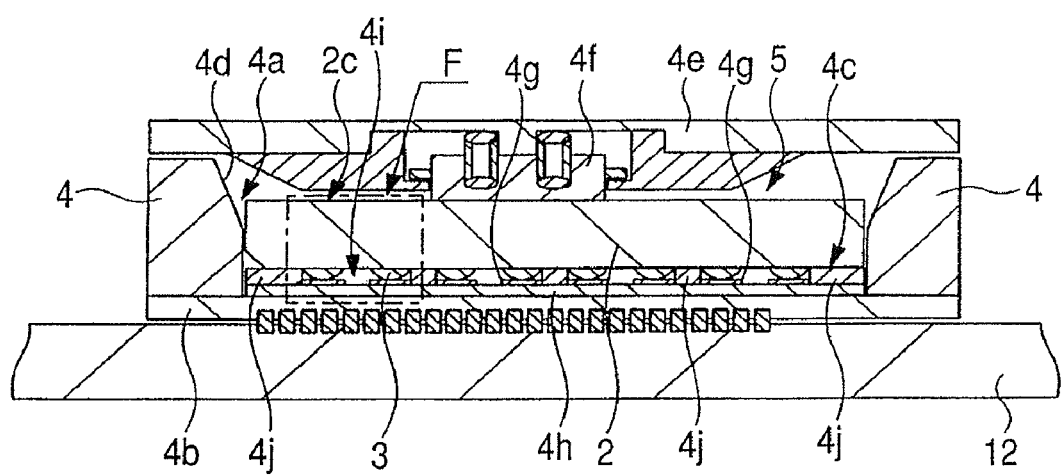
FIG. 14 is a partial section showing one example of structure of the state in which a socket for inspection in a mode of carrying out the invention is fitted to the semiconductor device.
Figure 15:
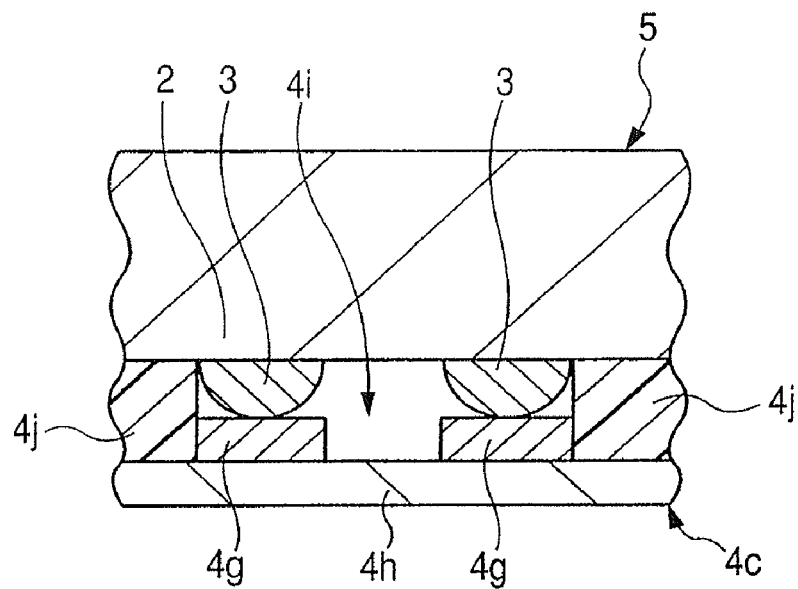
FIG. 15 is an enlarged partial section showing the structure of part F in FIG. 14.
Figure 16:
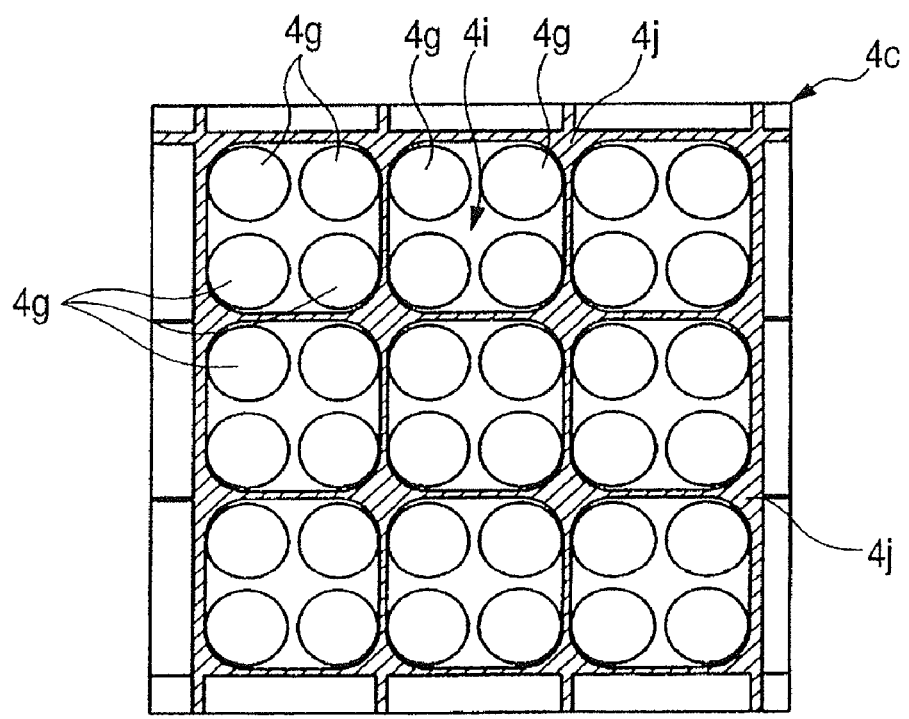
FIG. 16 is a plan showing one example of structure of a contact sheet in the socket for inspection shown in FIG. 14.
Figure 17:
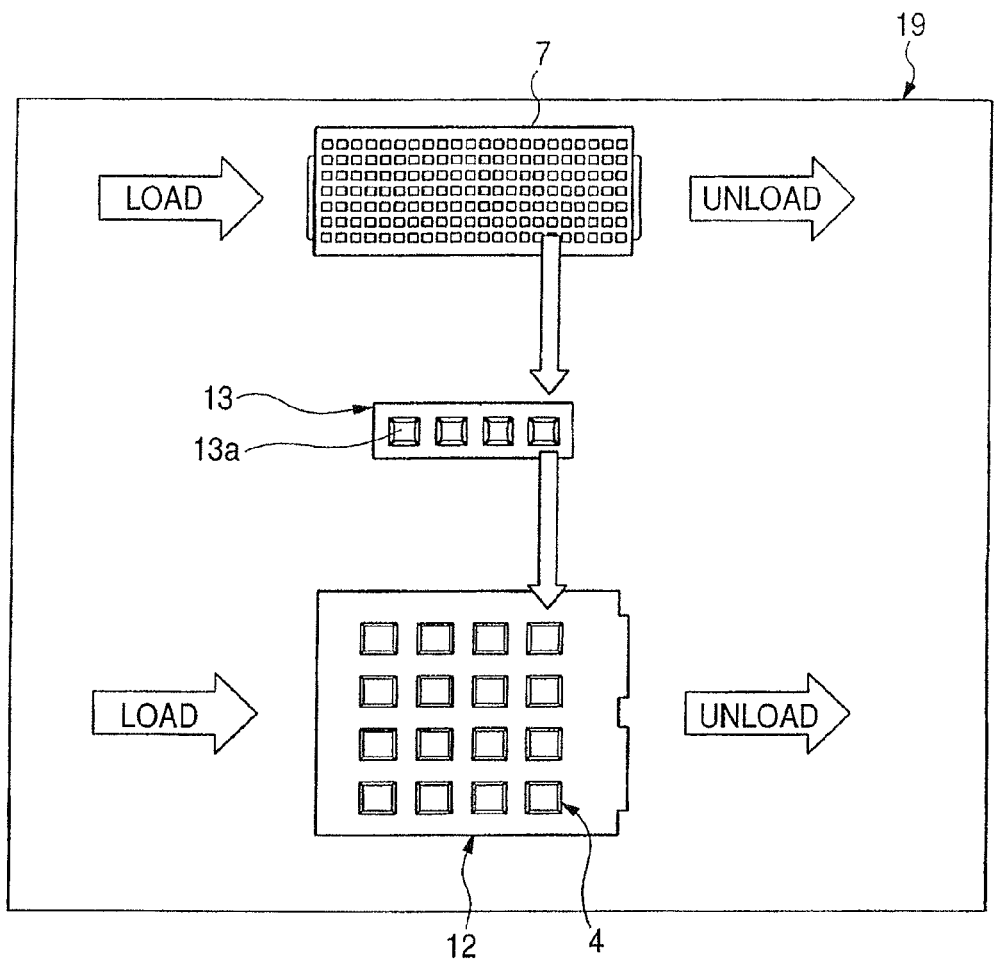
FIG. 17 is a plan showing one example of structure of an intermediate pocket portion (relaying jig) of an automatic attaching/detaching device used in the post-production process of assembling the semiconductor device shown in FIG. 1.
Figure 18:
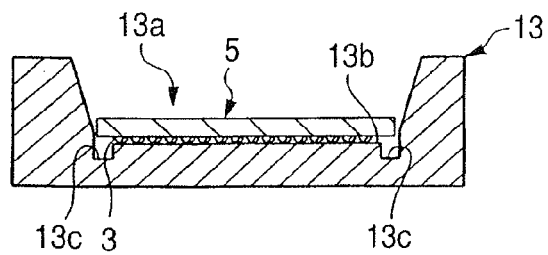
FIG. 18 is a section showing the structure of the accommodating portion of the intermediate pocket portion shown in FIG. 17.

FIG. 1 shows a plan of one example of structure of semiconductor device manufactured by the semiconductor device manufacturing method in a mode of carrying out the present invention; FIG. 2, a profile of the structure of the semiconductor device shown in FIG. 1; FIG. 3, an enlarged partial plan of part A in FIG. 1; FIG. 4, a partial section showing the structure cut along line A-A in FIG. 3; FIG. 5 comprises a process flow chart and a section showing one example of procedure of the front-end process (wafer process) in the assembling of the semiconductor device shown in FIG. 1; FIG. 6, a process flow chart, a perspective view and a section showing part of one example of procedure of the post-production process in the assembling of the semiconductor device shown in FIG. 1; FIG. 7, a process flow chart and a perspective view showing part of one example of procedure of the post-production process in the assembling of the semiconductor device shown in FIG. 1; FIG. 8 is a plan showing one example of structure of a tray in a mode of carrying out the invention; FIG. 9, a section showing one example of structure of the accommodating portion the tray shown in FIG. 8; FIG. 10, a partial perspective view one example of structure of the base in the accommodating portion of the tray shown in FIG. 9; FIG. 11, section showing one example of method of accommodating a semiconductor device in the tray shown in FIG. 9; FIG. 12, a partial section showing one example of structure of the tray-stacked state cut along line D-D shown in FIG. 8; FIG. 13, a partial section showing one example of structure of the tray-stacked state cut along line E-E shown in FIG. 8; FIG. 14, a partial section showing one example of structure of the state in which a socket for inspection in a mode of carrying out the invention is fitted to the semiconductor device; FIG. 15, an enlarged partial section showing the structure of part F in FIG. 14; FIG. 16, a plan showing one example of structure of a contact sheet in the socket for inspection shown in FIG. 14; FIG. 17, a plan showing one example of structure of an intermediate pocket portion (relaying jig) of an automatic attaching/detaching device used in the post-production process of assembling the semiconductor device shown in FIG. 1; FIG. 18, a section showing the structure of the accommodating portion of the intermediate pocket portion shown in FIG. 17; and FIG. 19, an enlarged partial section showing one example of structure of a test socket used in the post-production process of assembling the semiconductor device shown in FIG. 1.

The semiconductor device in this mode of implementing the invention is a wafer level CSP (which may also be referred to as wafer process package) 5 assembled by a manufacturing technique integrating a wafer process (front-end process) and a packaging process (post-production process).

To describe the configuration of the wafer level CSP 5 shown in FIG. 1 through FIG. 4, it comprises a semiconductor chip 2 and solder bumps (ball electrodes) 3. The semiconductor chip 2 has a main surface 2b, pads 2a which are a plurality of electrodes arranged over the main surface 2b, rearranging wirings 2e which are formed over the main surface 2b and alter the arrangement of the plurality of pads 2a, and an insulating film formed over the main surface 2b. The solder bumps 3, which are a plurality of external terminals each connected to one or another of the rearranging wirings 2e, are disposed in a different arrangement from that of the plurality of pads 2a. As shown in FIG. 4, an organic film 2i, consisting of an insulative polyimide or the like, is formed over a re-wiring layer in which the rearranging wirings 2e are formed.

To further describe the configuration of the wafer level CSP 5, it comprises the semiconductor chip 2 and the plurality of solder bumps 3. The semiconductor chip 2 has the main surface 2b, a rear surface 2c opposite to the main surface, side surfaces 2d, an integrated circuit formed over the main surface 2b, an organic film 2i covering the main surface 2b, the pads 2a which are a plurality of electrodes exposed from the organic film 2i and arrayed at first spacing over the main surface 2b, and the plurality of rearranging wirings 2e, which are a plurality of rearranging wirings 2e (wirings) formed over the organic film 2i and of which one end of each is electrically connected to one or another of the pads 2a, which are a plurality of electrodes, and the other ends are arranged at second spacing, wider than the first spacing. The plurality of solder bumps 3 are arranged over the other ends of the plurality of the rearranging wiring 2e, and each is electrically connected to one or another of the other ends of the plurality of rearranging wirings 2e.

Incidentally, each of the side surfaces 2d is a cut surface formed when individual packages are fragmented by dicing from the wafer state.

The wafer level CSP 5, unlike a semiconductor device whose chip is packaged by using a sealing resin or the like, has a structure in which the side surfaces 2d and the rear surface 2c of the semiconductor chip 2 are exposed.

Further in the wafer level CSP 5, as shown in FIG. 1 and FIG. 2, the solder bumps (protruding electrodes) 3, which are a plurality of external terminals, are arranged in an array over the main surface 2b of the semiconductor chip 2, similarly to a ball grid array (BGA) in appearance.

In the wafer level CSP 5, as shown in FIG. 3 and FIG. 4, the rearranging wirings 2e are further connected to the pads 2a which are electrodes formed over the main surface 2b of the semiconductor chip 2, and the solder bumps 3 are connected to these rearranging wirings 2e via an Au layer 2p. The rearranging wirings 2e are relay wirings for replacing the arrangement of the pads 2a, consisting of aluminum or the like, with wirings on which the solder bumps 3 can be mounted. Thus in the wafer level CSP 5, the arrangement pitch of the pads 2a are narrowed, and accordingly the solder bumps 3, which are external terminals, cannot be directly mounted on the pads 2a, and therefore the pitch is widened with the rearranging wiring 2e to enable the solder bumps 3 to be mounted, the solder bumps 3 being connected to the rearranging wiring 2e.

In this way, it is made possible to arrange the plurality of solder bumps 3 in an array form.

To add, the rearranging wiring 2e has a three-layered structure of, for instance, an Ni layer 2j, a Cu layer 2m and a Cr layer 2n. The Ni layer 2j, the Cu layer 2m and the Cr layer 2n are arranged from the surface side inward in that order, the Cr layer 2n being connected to the pads 2a. The Ni layer 2j is connected to the solder bumps 3 via the Au layer 2p for better connection to the solder bumps.

Over the layer above a silicon substrate 2k, there is formed a metallic wiring layer via an insulating layer 2f, which is an inter-layer insulating film.

The pads 2a formed over the main surface 2b are covered by a protective film 2g, which is a passivation film, except in the connecting parts to the rearranging wiring 2e. Over the protective film 2g, a first insulating film 2h is stacked, and the rearranging wirings 2e are stacked and arranged over this first insulating film 2h. In the layer farther above the rearranging wirings 2e, the organic film 2i, which is a second insulating film, is stacked in a state except in the connecting parts of the solder bumps 3.

To add, the protective film 2g consists of SiN, for instance, and the first insulating film 2h and the organic film 2i, which is the second insulating film, are soft films consisting of polyimide or the like.

Next, the method of manufacturing wafer level CSPs 5 (semiconductor devices) of this embodiment will be described separately for its front-end process (wafer process) shown in FIG. 5 and the post-production process shown in FIG. 6 and FIG. 7.

First in the front-end process (wafer process) charted in FIG. 5, after preparing wafers at step S1, the first insulating film of polyimide is formed at step S2. Here, the main surface 2a of each semiconductor wafer 1 is covered with the first insulating film 2h, followed by exposure to light and etching to remove the first insulating film 2h over the pads 2a, and then the first insulating film 2h is baked.

After that, the formation of a Cr—Cu layer shown as step S3 is accomplished by sputtering or otherwise to form an underlayer for the rearranging wirings 2e. Then, the formation of a Cr—Ni layer shown as step S4 is accomplished. Here, the Cr—Ni layer is formed over the Cr—Cu layer by plating, and patterning is carried out by etching to form the rearranging wirings 2e consisting of Cr, Cu and Ni layers.

After that, the formation of the organic film 2i, which is the second insulating film, shown as step S5 is accomplished. The organic film 2i, like the first insulating film 2h, is a polyimide film for instance. First, the rearranging wirings 2e are covered with the organic film 2i, followed by exposure to light and etching to remove the organic film 2i over the solder bump connecting portions, and the organic film 2i is baked.

After that, non-electrolytic plating shown as step S6 is accomplished. Thus, the Au layer 2p is formed over the solder bump connecting portions of the rearranging wiring 2e by plating.

After that, a probe test shown as step S7 is conducted, and the formation of solder bumps shown as step S8 is accomplished. Thus the solder bumps 3, which are external terminals, are formed by reflowing to the Au layer 2p or otherwise.

In this way, the front-end process (wafer process) in the manufacture of the wafer level CSP 5 is completed.

This is followed by the post-production process shown in FIG. 6 and FIG. 7.

First, wafers are prepared at step S11 of FIG. 6. Each semiconductor wafer 1 has a plurality of device areas (semiconductor device formation areas) 1c provided with the organic film 2i covering the rearranging wirings 2e formed over the main surface 2b and a plurality of solder bumps (ball electrodes) 3, which are external terminals arranged correspondingly to a plurality of opening portions of the organic film 2i.

After that, dicing and loading in a jig shown as step S12 in FIG. 6 are accomplished. First by the dicing, the semiconductor wafer 1 is divided along dicing lines 1b according to the device areas 1c. Thus, a blade 9 is run along the dicing lines 1b to fragment the semiconductor wafer 1 into individual pieces to form a plurality of wafer level CSPs 5.

Then the fragmented wafer level CSPs 5, after they are picked up by thrusting them up with a pickup portion 8, are accommodated into a dedicated case jig 10. In this process, so that the plurality of solder bumps 3, which are external terminals of the wafer level CSPs 5 face upward, the wafer level CSPs 5 are loaded into the dedicated case jig 10 in a state in which the rear surface 2c of the semiconductor chip 2 faces downward.

After that, laser marking shown as step S13 is accomplished. In this mode of implementation, a tray 7 for accepting balls is made ready in advance of this step, and laser marking is accomplished on the wafer level CSPs 5 accommodated in this tray 7.

The tray 7 for accepting balls accommodates chip size packages, such as the wafer level CSPs 5, in a state of supporting the plurality of solder bumps (ball electrodes) 3 provided as their external terminals.

FIG. 8 shows one example of structure of the tray 7 for accepting balls. On the front surface 7f (see FIG. 12) side of the tray 7, a plurality of pockets (accommodating portions) 7a, each of which can accommodate a wafer level CSP 5, are disposed in a matrix arrangement, and each of the pockets 7a is provided with a base 7b for supporting the plurality of solder bumps (ball electrodes) 3 of the wafer level CSP 5 and side walls 7c formed around the base 7b as shown in FIG. 9.

Hereupon, it will be explained why the tray 7 in this embodiment of the invention can support the ball electrodes (solder bumps 3), which are external terminals of the semiconductor device.

Semiconductor devices accommodable by the tray 7 in this embodiment are small and light packages, such as the wafer level CSPs 5 for instance, in which the side surfaces 2d and the rear surface 2c of the semiconductor chip 2 are exposed, the package size is substantially equal to the chip size, and the weight of the semiconductor chip 2 itself is the weight of the package as it is.

Thus, semiconductor devices accommodable by the tray 7 look like BGAs in which the solder bumps 3, which are ball electrodes, are disposed in a matrix arrangement as external terminals. However, while a conventional BGA would have a sealing epoxy resin in which a filler or the like is mixed, a BGA substrate, metal wires and a paste material among other things, the wafer level CSP 5 has no sealing epoxy resin, BGA substrate, metal wires or paste material, and accordingly its weight is much lighter than that of any conventional BGA and substantially equal to the weight of a semiconductor chip by itself.

Therefore, even though the base 7b of the pockets 7a in the tray 7 supports the solder bumps 3, the solder bumps 3 will not be crushed but can accept the balls.

Incidentally, in the wafer level CSP 5, over the rearranging wirings 2e of the main surface 2b of the semiconductor chip 2, there is formed the organic film 2i of polyimide or the like intended to insulate them. In the conventional tray in which the accommodating portion supports the organic film 2i over the main surface 2b of the semiconductor chip 2, there occurs such a trouble that the organic film 2i, because of its thinness, is peeled off by the vibration during carriage or comes off to become foreign matter. A conceivable remedy is to make the organic film 2i thicker to prevent it from being peeled off or coming off, but the opening portions bored in the organic film 2i for the connection of the solder bumps 3 are formed by photolithography.

If then the organic film 2i is thickened, it will be difficult to form the opening portions by photolithography or, if the opening portions are too deep, the solder bumps 3 cannot reach the Au layer 2p. Furthermore, if the opening portions are enlarged in area, it will be difficult to arrange the pads 2a in a fine pitch, and therefore it is not desirable to thicken the organic film 2i. Incidentally, as the organic film 2i is a soft film, it is susceptible to flaws, or if it is thickened, foreign matter may increase. Further to securely protect the wirings, the organic film 2i should be formed thick enough to surpass the height of the solder bumps 3, and accordingly it is undesirable to thicken the organic film 2i.

Therefore, the tray 7 which is enabled to accept balls, as in this embodiment, by not only covering the main surface 2b of the semiconductor chip 2 with the organic film 2i but also being intended specifically to accommodate a semiconductor device which is about equal in weight to the semiconductor chip 2 is extremely effective.

To add, in the wafer level CSP 5, the thicknesses of its organic film 2i and first insulating film 2h are about 5 μm for instance, the pad pitch of the semiconductor chip 2, about 80 μm for instance, the bump pitch, about 0.4 to 0.5 mm for instance, and the bump diameter, about 0.2 to 0.25 mm for instance.

Further, the tray 7 is formed of an insulative resin material in which electroconductive particles of carbon, for instance, are mixed.

According to the way in which the tray 7 of this embodiment is used, during carriage in the post-production process of manufacturing wafer level CSPs 5 or on other like occasions, the organic film 2i of the main surface 2b of the semiconductor chip 2 is not supported when the wafer level CSP 5 are accommodated in the pockets 7a of this tray 7. Instead, the plurality of solder bumps 3 are supported by the base 7b, and therefore it is made possible to prevent the organic film 2i from being flawed or coming off and adhering to the product as foreign matter.

As a result, troubles in electrical performance such as the exposure of wirings by the coming-off of the organic film 2i to invite short-circuiting can be prevented, and the quality of the wafer level CSPs 5 (intended products) can be improved.

Furthermore, since the organic film 2i can be prevented from being flawed or peeled off, the external appearance of the wafer level CSPs 5 can also be improved.

Since the quality of the wafer level CSPs 5 can be improved as described above, the yield of the wafer level CSPs (intended products) can be enhanced. To add, the use of the tray of this embodiment can reduce the probability for the organic film 2i to come off, for instance, from 50% to 1%.

Further, as shown in FIG. 9, in each of the pockets 7a of the tray 7, first groove portions 7d are formed around the base 7b. Thus, in each of the pockets 7a, there are formed the first groove portions 7d adjoining the circumference of the base 7b and depressed to a lower level than the base 7b.

Foreign matter, such as waste silicon, arising within the pockets 7a can be thereby caused to drop into these first groove portions 7d and prevented from sticking to the wafer level CSPs 5.

To add, since the tray 7 uses a ball accepting system of supporting the wafer level CSPs 5 with the solder bumps 3, the height of the bumps surpassing the wafer level CSPs themselves can prevent foreign matter, such as waste silicon, generated by the vibration during carriage or on like occasions from sticking to the wafer level CSPs themselves unless its quantity is too great.

In the tray 7 of this embodiment, a second groove portion 7e is also formed in its base 7b as shown in FIG. 10. The second groove portion 7e may be formed, for instance, in a cross shape in the base 7b. Although the appropriate shape of the second groove portion 7e is not limited to a cross if only it is formed in the base 7b, it is desirable for the second groove portion 7e to be formed continuous from the base 7b to the first groove portion 7d.

Thus, the presence of the second groove portion 7e in the base 7b of the pockets 7a in the tray 7 causes, when no wafer level CSP 5 is accommodated in the pockets 7a, vacuum exhaust to leak from the second groove portion 7e in the base 7b when a vacuum pad 20 sucks a pocket 7a as shown in FIG. 11, and accordingly the vacuum pad 20 can be prevented from attracting the tray 7.

Further, the tray 7 has such a structure that, as shown in FIG. 12 and FIG. 13, when a plurality of trays 7 are stacked, at least part of the space between the rear surface 7g of the tray 7 of an upper level and the front surface 7f of the tray 7 of a lower level communicates with outside the tray 7.

Thus, the tray 7 of this embodiment has a structure in which no through hole is formed between the base 7b and the side wall 7c in any of its pockets 7a. Therefore, the structure is such that, when a plurality of trays 7 are stacked, the space between the tray 7 of the upper level and the tray 7 of the lower level is never totally sealed. In this structure, when trays 7 are stacked, an inner wall portion 7i disposed on the rear surface 7g of the upper tray 7 is supported by the surface of an outer wall portion 7j on the lower tray 7 as shown in FIG. 13. In this arrangement, a slight gap is formed between an outer wall 7h disposed on the outer circumference of the upper tray 7 and the front surface 7f side outer circumference of the outer wall portion 7j of the lower tray 7, part of the space surrounded by the upper tray 7 and the lower tray 7 communicate with outside the tray 7 via the gap. Therefore, an air escape can be formed via the gap as shown in FIG. 12 and FIG. 13.

In this way, when the upper tray 7 is to be separated from the lower tray 7 by either vacuum attraction or manually and taken out in a state in which a plurality of trays 7 are stacked, the lower tray 7 can be prevented from tightly adhering to and rising together with the upper tray 7.

As a result, the handling ease of the trays 7 can be improved to enhance the working efficiency.

Furthermore, the absence of through holes in the base 7b and the side walls 7c in any of the pockets 7a of the tray 7 serves to prevent, when a plurality of trays 7 are stacked, foreign matter such as silicon waste from falling from any pocket 7a of the upper tray 7 into the lower tray 7, and to reduce the adherence of foreign matter to trays 7 during carriage or on like occasions.

As described above, in the manufacturing process for semiconductor devices in this mode of implementing the invention, the trays 7 capable of ball-accepting wafer level CSPs 5 are used for their assembling.

In the laser marking process shown as step S13 in FIG. 6, wafer level CSPs 5 are marked in a state in which the wafer level CSPs 5 are ball-accepted on this tray 7. Thus, after fragmentation by dicing shown as step S12, the wafer level CSPs 5 are arranged in the pockets 7a of the tray 7, and the wafer level CSPs 5 are marked with a laser 11 in a state in which the solder bumps 3, which are a plurality of ball electrodes, are supported by the base 7b.

In ball acceptance using the tray 7, the rear surface 2c side of the semiconductor chip 2 of each wafer level CSP 5 faces upward when the wafer level CSP 5 is accommodated in one of the pockets 7a, marking with the laser 11 can be performed in a state in which the wafer level CSP 5 is accommodated in the tray 7.

After that, the wafer level CSP 5 is carried to the next process in a state of being accommodated on the tray 7, and undergoes reliability tests including a burn-in (B/I) test and BIST shown as step S14. The burn-in test is accomplished, for instance, with the wafer level CSP 5 being fitted to a burn-in socket (socket for inspection) 4 installed on a burn-in board 12 as shown in FIG. 14.

When performing the burn-in test, the tray 7 accommodating the wafer level CSPs 5 is set to an automatic attaching/detaching device 19 as shown in FIG. 17, the wafer level CSPs 5 are once transferred from the tray 7 to the pockets (second accommodating portions) 13a of an intermediate pocket portion 13, which is a relaying jig for the automatic attaching/detaching device 19, and aligned. After they are positioned in the intermediate pocket portion 13, the wafer level CSPs 5 are transferred from the intermediate pocket portion 13 to the burn-in sockets 4 on the burn-in board 12.

Each of the pockets 13a of the intermediate pocket portion 13 is provided with a second base 13b capable of supporting the plurality of solder bumps 3 of each wafer level CSP 5. When a wafer level CSP 5 is accommodated into a pocket 13a of the intermediate pocket portion 13, the plurality of solder bumps 3 of the wafer level CSP 5 are supported by the second base 13b as shown in FIG. 18. Thus, the wafer level CSP is ball-accepted by the intermediate pocket portion 13 of the automatic attaching/detaching device 19, too.

Since in this respect as well, the intermediate pocket portion 13 of the automatic attaching/detaching device 19 supports by its second base 13b the solder bumps 3 of the wafer level CSP 5 instead of the organic film 2i of the main surface 2b of its semiconductor chip 2, it is made possible to prevent the organic film 2i from being flawed or coming off to become foreign matter, which would stick to the intended product.

As a result, troubles in electrical performance such as the exposure of wirings by the coming-off of the organic film 2i to invite short-circuiting can be prevented, and the quality of the wafer level CSPs 5 can be improved. Furthermore, since the organic film 2i can be prevented from being flawed or peeled off, the external appearance of the wafer level CSPs 5 can also be improved. Since the quality of the wafer level CSPs 5 can be improved, the yield of the wafer level CSPs 5 can be enhanced.

Furthermore, third groove portions 13c are formed in each of the pockets 13a around the second base 13b as shown in FIG. 18. This arrangement can cause foreign matter, such as waste silicon, arising within the pockets 13a to drop into these third groove portions 13c and prevent it from sticking to the wafer level CSPs 5. As a result, chipping of the semiconductor chip 2 can be prevented. The reason for the absence of any groove for vacuum exhaust in the second base 13b of the intermediate pocket portion 13, unlike in the second groove portion 7e of the tray 7, is that the trays 7 are aligned before they are transferred to the burn-in sockets 4 and therefore a semiconductor ship 2 is accommodated in every one of the pockets 13a, leaving no possibility for the vacuum pad 20 to be attracted by the second base 13b. Moreover, even if there is any pocket 13a in which no chip is accommodated, as the intermediate pocket portion 13 is a fixed jig, there is no possibility to be sucked up by the vacuum pad 20 unlike the tray 7. The dispensability of any vacuum exhaust groove in the intermediate pocket portion 13 makes possible a corresponding saving in manufacturing cost.

Incidentally, the intermediate pocket portion 13, like the tray 7, is formed of an insulative resin material in which electroconductive particles of carbon or the like are mixed.

After positioning is accomplished with the intermediate pocket portion 13, each wafer level CSP 5 is transferred from the intermediate pocket portion 13 to the burn-in socket 4, which is a socket for inspection, to conduct a burn-in test.

The configuration of the burn-in socket 4 shown in FIG. 14 has a concave 4a formed to allow the arrangement of a wafer level CSP 5 by a bottom 4b and inner walls 4d, a top lid 4d provided with a pressing portion 4f for pressing the wafer level CSP 5 arranged in the concave 4a, and opening portions 4i in which the solder bumps 3 of the wafer level CSP 5 can be arranged. It further comprises insulative sheet members 4j for supporting the organic film 2i of the wafer level CSP 5, a plurality of terminal portions 4g which are arranged, matching the plurality of solder bumps 3 of the wafer level CSP 5, in the opening portions 4i of the sheet members 4j and can come into contact with the solder bumps 3 as shown in FIG. 15, and a conductor portion 4h in tight contact with the sheet members 4j and provided with wirings for connection to the terminal portions 4g. In each of the opening portions 4i in the sheet members 4j of a contact sheet 4c shown in FIG. 16, a plurality of terminal portions 4g are arranged.

The contact sheet 4c in this mode of implementation is configured of the sheet members 4j consisting of polyimide for instance, the terminal portions 4g with electroconductive plating, and the conductor portion 4h consisting of a copper foil or the like. A burn-in test, since it is conducted in a state in which a wafer level CSP 5 is pressed by the pressing portion 4f, may deform the shape of the solder bumps 3 by imposing loads on the solder bumps 3. For this reason, the sheet members 4j are provided to serve as cushions against the pressure, but flaws due to the contact of the organic film 2i with wafer level CSPs 5 and foreign matter due to its peeling-off pose problems. In view of these problems, in this mode of implementation, four terminal portions 4g are disposed in each of the opening portions 4i in the sheet members 4j as shown in FIG. 16, and accordingly four solder bumps 3 are arranged per opening portion 4i in the sheet members 4j.

This provides a greater individual size of the opening portions 4i of the sheet members 4j than in the conventional members in which opening portions 4i are disposed matching individual solder bumps 3. As a result, the area of contact between the organic film 2i of the wafer level CSP 5 and the sheet members 4j of the contact sheet 4c is greater, and the generation of foreign matter from the organic film 2i can be reduced.

In conducting a burn-in test, the solder bumps 3 of the wafer level CSP 5 are brought into contact with terminal portions 4g as shown in FIG. 15, and the wafer level CSP 5 is so fitted to the burn-in socket 4 that the organic film 2i of the wafer level CSP 5 be supported by sheet members 4j.

As the areas of the positions in which the sheet members 4j support the organic film 2i become smaller then, factors contributing to the generation of foreign matter and waste silicon between the sheet members 4j and the wafer level CSP 5, and accordingly the occurrence of poor test results, can be reduced.

After the burn-in test is completed, the wafer level CSP 5 is transferred from the burn-in socket 4 to the tray 7, and subjected to retention baking, which is baking shown as step S15 in FIG. 6. The retention baking is accomplished in a state in which the wafer level CSP 5 is accommodated in the tray 7.

Figure 19:
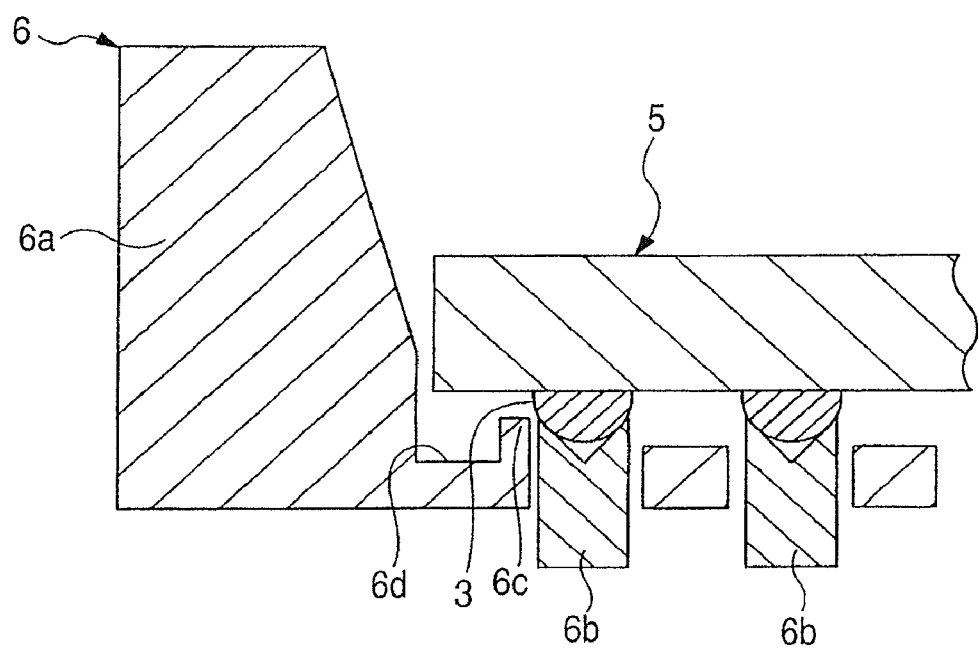
FIG. 19 is an enlarged partial section showing one example of structure of a test socket used in the post-production process of assembling the semiconductor device shown in FIG. 1.

After that, the wafer level CSP 5 kept accommodated in the tray 7 is carried to the next step, where it is subjected to testing shown as step S16. The tests at the testing step include, for instance, functional tests, for which the wafer level CSP 5 is transferred from the tray 7 to a test socket 6. As shown in FIG. 19, the test socket 6 consists of a floating base 6a disposed to be movable up and down, contact pins 6b to be in contact with the solder bumps 3 of the wafer level CSP, and a supporting portion 6c for supporting the wafer level CSP 5 until the solder bumps 3 come into contact with the contact pins 6b. A test (inspection) is conducted in a state in which the solder bumps 3 of the wafer level CSP 5 are kept in contact with the contact pins 6b to have the solder bumps 3 supported by the contact pins 6b. In the test socket 6, a fourth groove portion 6d is formed around the supporting portion 6c to accept falling foreign matter to prevent it from adhering to the wafer level CSP 5. In the floating base 6, as the organic film 2i is in contact with the supporting portion 6c until the solder bumps 3 come into contact with the contact pins 6b, there may arise a problem of foreign matter due to flaws on or coming-off of the organic film 2i. In view of this fear, with a view to reducing the area of contact between the organic film 2i and the supporting portion 6c, the contact face of the supporting portion 6c is L-shaped so as to support only a corner part of the wafer level CSP 5.

After the end of testing, the wafer level CSP 5 is again transferred from the test socket 6 to the tray 7, carried to the next step in a state in which the wafer level CSP 5 is accommodated in the tray 7, and at this step undergoes automatic appearance inspection shown as step S17 in FIG. 7. Here, the wafer level CSP 5 is transferred from the tray 7 to a jig for inspection 14, and its appearance is inspected on the jig for inspection 14.

After that, shipping tray refilling shown as step S18 is carried out. Thus, the tray 7 formed of a heat-resistant material and a shipping tray 15 formed of a non-heat-resistant material are made ready in advance. The heat-resistant tray 7 is used for processing and step-to-step carriage from the dicing (step S12) until automatic appearance inspection (step S17), not including the burn-in test and other testing, because those steps involve baking and other high-temperature treatment. As the steps and shipping involve no high-temperature treatment such as baking, the shipping tray 15 formed of a non-heat-resistant material is used at these steps.

Then, after the completion of automatic appearance inspection shown as step S17, the wafer level CSP 5 is transferred from the tray 7 formed of a heat-resistant material to the shipping tray 15 formed of a non-heat-resistant material. Structurally, the shipping tray 15 is exactly the same as the tray 7, and therefore the plurality of solder bumps 3 of the wafer level CSP 5 are ball-accepted by the base in the shipping tray 15 as well.

After the completion of the transfer to the shipping tray 15, final appearance inspection shown as step S19 is conducted. The final appearance inspection here is carried out by using a stereoscopic microscope or a metallurgical microscope in a state of accommodating the wafer level CSP 5 in the shipping tray 15.

After that, foreign matter removal shown as step S20 is performed. At this step, foreign matter on the shipping tray 15 is removed by either blowing air with an air blower device or the like on, or sucking foreign matter from, the shipping tray 15 accommodating the wafer level CSP 5.

Then, packing shown as step S21 is performed. A plurality of shipping trays 15, each accommodating wafer level CSPs 5, are stacked one over another, put into an aluminum moisture-proof bag 17 or the like, and sealed. After being bound with a band 18, the bag is put into an internally or externally armored box and shipped at step S22. Incidentally, as the shipping tray 15 is the same as the tray 7 structurally, the package is shipped in a state in which the plurality of solder bumps 3 of each wafer level CSP 5 are supported.

By making available the tray 7 formed of a heat-resistant material and the shipping tray 15 formed of a non-heat-resistant material in this way, it is made possible to use the heat-resistant tray 7 in the step-to-step carriage in the manufacturing process for wafer level CSPs 5 and the non-heat-resistant shipping tray 15 for shipping the wafer level CSPs 5. Thus, it is made possible to use the non-heat-resistant shipping tray 15 for shipping 15 and the heat-resistant shipping tray 15 discriminately for step-to-step carriage and shipping, respectively, and the overall cost of trays can be made lower than in the conventional practice of using more expensive heat-resistant trays 7 solely, because the non-heat-resistant material is less expensive than the heat-resistant material.

Furthermore, as the shipping tray 15 also has a ball-accepting structure, occurrence of foreign matter due to the peeling-off of the organic film 2i by vibration can be prevented by shipping the wafer level CSPs 5 in a state of being mounted on the shipping tray 15 where their solder bumps 3 are supported in the transportation after the shipping.

While the invention accomplished by the present inventors has been described so far in specific terms with reference to a preferred embodiment thereof, obviously the invention is not confined to this embodiment, but can be modified in various ways without deviating from its true spirit and scope.

For instance, the foregoing description referred to a case in which the tray 7 formed of a heat-resistant material and the shipping tray 15 formed of a non-heat-resistant material are made available, and the former is used for step-to-step carriage and prescribed processes (e.g. high-temperature treatment) while the latter is used for shipping. However, it is not absolutely necessary to make available the shipping tray 15 formed of a non-heat-resistant material, but only the tray 7 formed of a heat-resistant material can be made ready and used for shipping as well as for step-to-step carriage and prescribed processes.

The present invention can be suitably applied to trays, sockets and methods of manufacturing semiconductor devices.

What is claimed is:

1. A method of carrying semiconductor devices, comprising steps of:
providing a tray provided with a plurality of accommodating portions, each capable of accommodating the semiconductor devices; and
carrying the semiconductor devices by using the tray,
wherein the semiconductor device comprises a semiconductor substrate having a main surface and a rear surface opposite to the main surface, a wiring layer formed over the main surface, an organic film covering the wiring layer and containing opening portions in which the wiring layer is partly exposed, and a plurality of ball electrodes electrically connected to the wiring layer, and
wherein each of the accommodating portions has a base to support the plurality of ball electrodes of the semiconductor device, and side walls formed around the base.

2. The method according to claim 1, wherein the carrying step is performed in a process of manufacturing the semiconductor devices.

3. The method according to claim 1, wherein the carrying step is performed in a shipping step.

4. The method according to claim 1, wherein the rear surface and a side surface of the semiconductor substrate are exposed.

5. The method according to claim 1, wherein the tray is comprised of an insulative material in which electroconductive particles are mixed.

6. The method according to claim 1, wherein a size of the semiconductor device is substantially equal to a size of the semiconductor substrate.

7. A method of manufacturing an electric device, comprising steps of:
carrying semiconductor devices by using a tray provided with a plurality of accommodating portions each capable of accommodating the semiconductor devices,
the semiconductor devices each comprising a semiconductor substrate having a main surface and a rear surface opposite to the main surface,
each of the semiconductor devices comprising a wiring layer formed over the main surface,
each of the semiconductor devices comprising an organic film covering the wiring layer and containing opening portions in which the wiring layer is partly exposed; and each of the semiconductor devices comprising a plurality of ball electrodes electrically connected to the wiring layer,
wherein each of the accommodating portions has a base and side walls formed around the base, and
wherein the base supports the plurality of ball electrodes of the semiconductor device.

8. The method according to claim 7, wherein the rear surface and a side surface of the semiconductor substrate are exposed.

9. The method according to claim 7, wherein the tray is comprised of an insulative material in which electroconductive particles are mixed.

10. The method according to claim 7, wherein a size of the semiconductor device is substantially equal to a size of the semiconductor substrate.

* * * * *